United States Patent
Lin et al.

(10) Patent No.: US 11,466,379 B2
(45) Date of Patent: Oct. 11, 2022

(54) MANUFACTURING METHOD OF COPPER FOIL AND CIRCUIT BOARD ASSEMBLY FOR HIGH FREQUENCY SIGNAL TRANSMISSION

(71) Applicant: NAN YA PLASTICS CORPORATION, Taipei (TW)

(72) Inventors: Shih-Ching Lin, Taipei (TW); Fu-Je Chen, Chiayi (TW); Kuo-Chao Chen, Taipei (TW)

(73) Assignee: NAN YA PLASTICS CORPORATION, Taipei (TW)

( * ) Notice: Subject to any disclaimer, the term of this patent is extended or adjusted under 35 U.S.C. 154(b) by 477 days.

(21) Appl. No.: 16/211,366

(22) Filed: Dec. 6, 2018

(65) Prior Publication Data

US 2019/0182964 A1  Jun. 13, 2019

(30) Foreign Application Priority Data

Dec. 8, 2017  (TW) .................................. 106143191

(51) Int. Cl.
*C25D 5/00*  (2006.01)
*H05K 3/24*  (2006.01)
(Continued)

(52) U.S. Cl.
CPC ............... *C25D 5/605* (2020.08); *C25D 1/04* (2013.01); *C25D 5/10* (2013.01); *C25D 5/34* (2013.01);
(Continued)

(58) Field of Classification Search
CPC .......... H05K 3/241; H05K 3/022; H05K 3/00; H05K 2203/0723
See application file for complete search history.

(56) References Cited

U.S. PATENT DOCUMENTS 5,431,803 A * 7/1995 DiFranco ................. C25D 1/04
205/50
6,132,589 A * 10/2000 Ameen ................... C23C 26/00
205/177

(Continued)

FOREIGN PATENT DOCUMENTS

CN       1657279 A     8/2005
CN     106086973 A    11/2016
(Continued)

*Primary Examiner* — Louis J Rufo
(74) *Attorney, Agent, or Firm* — Li & Cai Intellectual Property (USA) Office

(57) ABSTRACT

A manufacturing method of copper foil and circuit board assembly for high frequency transmission are provided. Firstly, a raw copper foil having a predetermined surface is produced by an electrolyzing process. Subsequently, a roughened layer including a plurality of copper particles is formed on the predetermined surface by an arsenic-free electrolytic roughening treatment and an arsenic-free electrolytic surface protection treatment. Thereafter, a surface treatment layer is formed on the roughened layer, and the roughened layer is made of a material which includes at least one kind of non-copper metal elements and the concentration of the non-copper metal elements is smaller than 400 ppm. By controlling the concentration of the non-copper elements, the resistance of the copper foil can be reduced.

19 Claims, 4 Drawing Sheets

(51) Int. Cl.
*H05K 1/02* (2006.01)
*H05K 3/06* (2006.01)
*H05K 3/02* (2006.01)
*C25F 3/02* (2006.01)
*C25D 5/34* (2006.01)
*C25D 5/10* (2006.01)
*C25D 7/06* (2006.01)
*C25D 5/50* (2006.01)
*C25D 1/04* (2006.01)
*C25D 5/48* (2006.01)
*C25D 3/56* (2006.01)
*C25D 3/04* (2006.01)
*C25D 3/38* (2006.01)

(52) U.S. Cl.
CPC ............... *C25D 5/48* (2013.01); *C25D 5/50* (2013.01); *C25D 7/0614* (2013.01); *C25F 3/02* (2013.01); *H05K 1/0237* (2013.01); *H05K 3/022* (2013.01); *H05K 3/06* (2013.01); *H05K 3/241* (2013.01); *C25D 3/04* (2013.01); *C25D 3/38* (2013.01); *C25D 3/565* (2013.01); *H05K 2201/015* (2013.01); *H05K 2201/0141* (2013.01); *H05K 2203/0307* (2013.01); *H05K 2203/068* (2013.01); *H05K 2203/0723* (2013.01)

(56) References Cited

U.S. PATENT DOCUMENTS

| | | | |
|---|---|---|---|
| 6,132,887 A * | 10/2000 | Clouser | C25D 1/04 205/291 |
| 2011/0262764 A1 * | 10/2011 | Arai | H05K 3/384 428/551 |
| 2012/0205146 A1 * | 8/2012 | Oguro | C25D 5/10 174/257 |
| 2016/0183380 A1 * | 6/2016 | Ishii | B32B 15/20 428/601 |
| 2019/0145014 A1 | 5/2019 | Chen et al. | |

FOREIGN PATENT DOCUMENTS

| | | |
|---|---|---|
| JP | 9-272994 A | 10/1997 |
| JP | 2004256910 A | 9/2004 |
| JP | 2006253345 A | 9/2006 |
| JP | 2011168887 A | 9/2011 |
| JP | 6058182 B1 | 1/2017 |
| TW | 201116653 A1 | 5/2011 |
| WO | 2012043182 A1 | 4/2012 |
| WO | 2017026500 A1 | 2/2017 |

* cited by examiner

MANUFACTURING METHOD OF COPPER FOIL AND CIRCUIT BOARD ASSEMBLY FOR HIGH FREQUENCY SIGNAL TRANSMISSION

CROSS-REFERENCE TO RELATED PATENT APPLICATION

This application claims the benefit of priority to Taiwan Patent Application No. 106143191, filed on Dec. 8, 2017. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

BACKGROUND

1. Technical Field

The present disclosure relates to an electrolytic copper foil and a method of manufacturing a circuit board assembly, and more particularly to a method of manufacturing a copper foil for high frequency signal transmission, and a method of manufacturing a circuit board assembly for high frequency signal transmission.

2. Description of Related Art

In the field of printed circuit boards, a conventional copper foil is provided by forming a raw foil on the cathode wheel by electroplating, and then subjected to treatments to form a final product. The treatments include performing a roughening treatment on the rough surface of the raw foil to form a plurality of copper particles on the rough surface of the raw foil, thereby increasing the bonding strength between the copper foil and the substrate of the circuit board, that is, increasing the peel strength of the copper foil.

In recent years, the data processing speed and communication speed of electronic products have tended to develop toward high frequency and high speed. At present, most research reveal that the shape of the copper foil surface has a great influence on the transmission loss when transmitting high frequency signals. That is to say, copper foils with larger surface roughness have a longer signal propagation distance, which may cause signal attenuation or delay. On the other hand, as the frequency of transmission increases, the skin effect on the surface of the circuit becomes more pronounced. That is, the current in the conductor will be concentrated on the surface of the conductor, which leads to an increase of the resistance and delay of the signal as the area of the cross-section on which the current flows decreases.

Therefore, the industry is currently working on reducing the surface roughness of the copper foil to reduce transmission loss and meet the needs of high-frequency signal transmission. However, due to the limitations of the conventional process, it has been difficult to further reduce the surface roughness of the copper foil. In addition, although reducing the surface roughness of the copper foil can reduce the transmission loss of the high-frequency signal, the bonding strength between the copper foil and the circuit substrate would also be reduced, thereby causing the copper foil to peel off from the circuit substrate easily and decreasing the reliability of printed circuit boards.

SUMMARY

The present disclosure is to provide a copper foil and a method of manufacturing a circuit board assembly for high frequency signal transmission.

An exemplary embodiment of the present disclosure provides a method of manufacturing a copper foil for high frequency transmission, including: producing a raw copper foil having a predetermined surface by an electrolyzing process; forming a roughened layer on the predetermined surface of the raw copper foil, wherein the step of forming a roughened layer further includes an arsenic-free electrolytic roughening treatment and an arsenic-free electrolytic surface protection treatment; and forming a surface treatment layer on the roughened layer, wherein the surface treatment layer is made of a material including at least one non-copper metal element, and the concentration of the non-copper metal element is smaller than 400 ppm.

Another exemplary embodiment of the present disclosure provides a manufacturing method of circuit board assembly for high frequency transmission, including: providing a copper foil manufacturing by the above-mentioned method, wherein the copper foil has laminating surface; and laminating a substrate with the copper foil by the laminating surface.

The effects of the present disclosure are that the present disclosure improves the purity of the copper foil and reduces the resistance of the electrolytic copper foil by controlling the content of non-copper elements in the copper foil. In particular, the non-copper elements may be non-copper metallic elements (e.g., zinc, chromium, nickel) and/or non-metallic elements (e.g., arsenic). Thereby, the conductivity of electrolytic copper foil of the present disclosure can be increased without reducing the surface roughness any further. Therefore, the electrolytic copper foil of the embodiment of the present disclosure has a lower electrical loss when applied to a wiring board assembly that transmits a high frequency signal. Further, since the surface roughness of the electrolytic copper foil is maintained at a constant value, the bonding strength between the electrolytic copper foil and the substrate would not have to be reduced due to low electrical loss.

In order to further understand the techniques, means and effects of the present disclosure, the following detailed descriptions and appended drawings are hereby referred to, such that, and through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
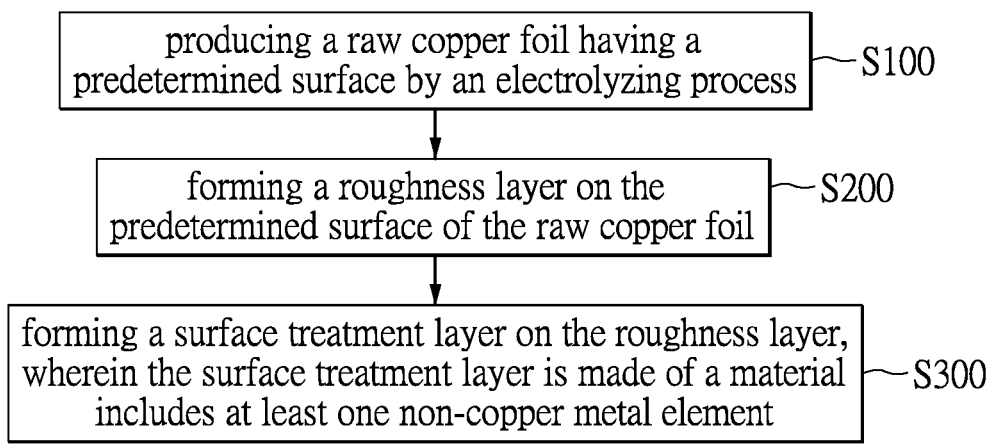
FIG. 1 is a flowchart of the method of manufacturing a copper foil for high frequency transmission of the present disclosure.

Reference will now be made in detail to the exemplary embodiments of the present disclosure, examples of which are illustrated in the accompanying drawings. Wherever possible, the same reference numbers are used in the drawings and the description to refer to the same or like parts.

Figure 2:
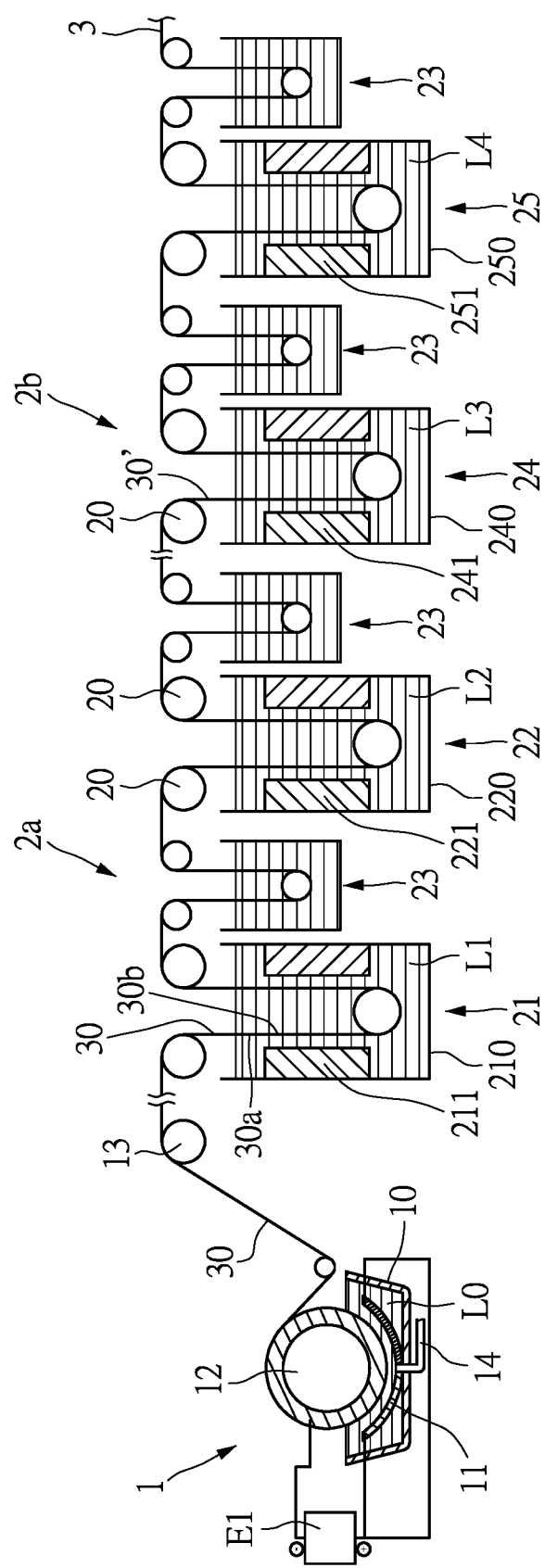
FIG. 2 is a schematic view of the system used to perform the method of FIG. 1.

Referring to FIG. 1 and FIG. 2, FIG. 1 is a flowchart of the method of manufacturing a copper foil for high frequency transmission of the present disclosure, and FIG. 2 is a schematic view of the system used to perform the method of FIG. 1.

As shown in FIG. 1, firstly, in step S100, a raw copper foil having a predetermined surface is produced by an electrolyzing process, the predetermined surface being a surface to-be-treated.

Referring to FIG. 2, the step of producing a raw copper foil by an electrolyzing process includes: providing a foil-forming device 1, which includes at least one electrolytic cell 10, an anode plate 11, a cathode wheel 12 and a roller 13.

More specifically, the electrolytic cell 10 is used to accommodate electrolyte L0. The anode plate 11 is disposed in the electrolytic cell 10, and electrically connected to the positive output of a power supply device E1. The anode plate 11 is formed by coating tantalum elements or its oxide on a titanium plate. The cathode wheel 12 is disposed corresponding to the electrolytic cell 10 and above the anode plate 11. Further, the cathode wheel 12 is electrically connected to the negative output of the power supply device E1. In the embodiment of the present disclosure, the cathode wheel 12 is a titanium roller.

In addition, in the embodiment of the present disclosure, the foil-forming device 1 further includes a flow-guiding tube 14 in fluid communication with the electrolytic cell 10. The above-mentioned electrolyte L0 is injected into the electrolytic cell 10 through the flow-guiding tube 14, flooding the anode plate 11, so that a part of the cathode wheel 12 is immersed in the electrolyte L0.

In an embodiment of the present disclosure, the electrolyte L0 may include copper ions ($Cu^{2+}$), sulfuric acid, and chloride ions ($Cl^-$), wherein, copper ion concentration is 50 to 90 g/L, the sulfuric acid concentration is 50 to 120 g/L, and the chloride ion concentration would not exceed 1.5 ppm.

It should be noted that in the embodiment of the present disclosure, the electrolyte L0 has a low concentration or even no additive. In an embodiment, the concentration of the additive in the electrolyte L0 does not exceed 1 ppm. The above-mentioned additives may be organic or inorganic additives, for example: glue, compound with hydrogenation group, protein and high molecular weight polysaccharide (HEC), sodium thiopropane sulfonate (MPS), polyethylene glycol (PEG), etc. The said glue could be, for example, bovine gum, sodium polydithiodipropane sulfonate (SPS), and a tertiary amine compound. In another embodiment, the electrolyte L0 does not contain any additives at all.

Next, as shown in FIG. 2, the power supply device E1 outputs a direct current to the anode plate 11 and the cathode wheel 12, thereby applying a current to the electrolyte L0, so that the copper ions in the electrolyte L0 are deposited on the surface of the cathode wheel 12 to form an electrolytic. Copper foil 30.

In an embodiment of the present disclosure, the resistance of the copper foil 3 is further reduced by optimizing the microstructure of the raw copper foil 30, that is, controlling the grain size of the raw copper foil 30. Further, the grain size of the raw copper foil 30 is inversely related to the grain boundary, in other words, when the grain size of the raw copper foil 30 is larger, the grain boundaries are less. In particular, the grain boundary in raw copper foil 30 hinders or blocks electron transfer. Therefore, the less the grain boundaries of the raw copper foil 30 there are, the better the electrical performance of the copper foil 3 is.

It should be noted that the temperature of the electrolyte L0 is related to the initial grain size of the raw copper foil 30. Generally, the initial grain size of the raw copper foil 30 increases as the temperature of the electrolyte L0 increases. Therefore, in one embodiment of the present disclosure, the step of forming the raw copper foil 30 by an electrolyzing process further includes maintaining the temperature of the electrolyte L0 between 50 to 80° C., so that the initial grain size of the raw copper foil 30 can be between 0.1 to 10 μm, and the resistance value of the copper foil 3 can be further increased to reduce high-frequency signal transmission loss.

In another embodiment of the present disclosure, it is also possible to firstly maintain the temperature of the electrolyte L0 to be between 30 to 50° C., so that the initial grain size of the raw copper foil 30 is between 0.1 to 5 μm. After that, a heat treatment may be further applied, so that the final grain size of the raw copper foil 30 is between 5 to 10 μm. The temperature of the heat treatment is usually greater than the re-growth temperature of the initial grains. In one embodiment, the temperature of the heat treatment is between 125 to 200° C.

Further, when the raw copper foil 30 is formed by electrolysis of the electrolyte L0, the electrolyte L0 is continuously supplied into the electrolytic cell 10. Specifically, the electrolyte L0 may flow into the electrolytic cell 10 through the flow-guiding tube 14 to maintain the copper ion concentration of the electrolyte L0 in the electrolytic cell 10. In one embodiment, the electrolyte L1 having a flow rate of between 15 to 30 m3/hr is continuously supplied into the electrolytic cell 10. Referring to FIG. 2, the raw copper foil 30 formed on the surface of the cathode wheel 12 is peeled off from the surface of the cathode wheel 12 and passed through the roller 13 for subsequent processing.

In addition, the raw copper foil 30 has a rough surface 30a and a smooth surface 30b, the smooth surface is opposite to the rough surface 30a; wherein the smooth surface 30b is a surface of the raw copper foil 30 contacting the cathode wheel 12 during electrolysis, the roughness of the smooth surface 30b is relatively fixed. The rough surface 30a is a surface of the raw copper foil 30 contacting the electrolyte L0. The rough surface 30a or the smooth surface 30b of the raw copper foil 30 usually has a plurality of grains. In one embodiment, the ten point height of irregularities of the rough surface 30a of the raw copper foil 30 does not exceed 2 μm, for example, it can be in between 0.9 μm to 1.9 μm.

Next, proceed to referring to FIG. 2, in step S200, a roughened layer is formed on the predetermined surface of the raw copper foil. In addition, the step S200 of forming a roughened layer further includes performing at least one arsenic-free electrolytic roughening treatment and at least one arsenic-free electrolytic surface protection treatment.

In an embodiment of the present disclosure, the raw copper foil 30 would undergo the arsenic-free electrolytic roughening treatment twice and the arsenic-free electrolytic surface protection treatment twice, so as to form a roughened layer on the predetermined surface of the raw copper foil, wherein the predetermined surface could be at least one of the rough surface 30a and the smooth surface 30b.

Further, as the number of times of arsenic-free electrolytic roughening treatment and arsenic-free electrolytic surface protection treatment increases, the adhesion strength between the copper foil 3 and the substrate 4 can be increased, but the surface roughness of the electrolytic copper foil would also be increased. Therefore, the number of times and the order of the arsenic-free electrolytic roughening treatment and the arsenic-free electrolytic surface protection treatment can be adjusted according to the actual processing requirements.

It should be noted that due to the high resistance of arsenic, when the arsenic content in the copper foil is too high, the resistance value of the copper foil would increase. Thus, the embodiments of the present disclosure form an arsenic-free roughened layer by at least one arsenic-free electrolytic roughening treatment and at least one arsenic-free electrolytic surface protection treatment. Further, the arsenic-free electrolytic roughening treatment and the arsenic-free electrolytic surface protection treatment are all performed with an arsenic-free plating bath.

Referring to FIG. 2 the processing device 2a for performing step S200 includes a plurality of transfer units 20 disposed on a production line, at least one roughing unit 21, at least one curing unit 22, and a plurality of cleaning tanks 23, the numbers of the roughing unit 21, the curing unit 22, and the cleaning tank 23 can be adjusted according to actual needs. The plurality of transfer units 20 respectively transfer the raw copper foil 30 to the roughing unit 21, the cleaning tank 23, and the curing unit 22 according to a preset process.

The roughing unit 21 includes a roughening tank 210 for carrying a roughening plating bath L1 and a set of roughened anode plates 211 disposed in the roughening tank 210. As shown in FIG. 2, when the arsenic-free electrolytic roughening treatment is performed, the raw copper foil 30 is put into the roughening tank 210 loaded with the roughening plating bath L1. As previously mentioned, the roughening plating bath L1 is an arsenic-free plating bath including 3 to 40 g/L of copper, 100 to 140 g/L sulfuric acid and 5 to 20 ppm of tungstate ion (WO42-).

During the arsenic-free electrolytic roughening treatment, the set of roughened anode plates 211 and the raw copper foil 30 are respectively applied with a positive voltage and a negative voltage to reduce the copper ions in the roughening plating bath L1 and form multiple nodular copper particles on the raw copper foil 30. It should be noted that the roughening plating bath L1 of the embodiment of the present disclosure has a special composition, that is, the roughening plating bath L1 contains a relatively low concentration of copper, which limit the crystal growth direction of the nodular copper particles.

Further, during the arsenic-free electrolytic roughening treatment, the copper atoms can only be limited to be stacked in a more natural crystal growth direction (i.e., longitudinal direction) since the copper concentration in the roughening plating bath L1 is low. In other words, the nodular copper particles are more inclined to grow toward a direction perpendicular to the rough surface 30a of the raw copper foil 30, and are less likely to grow toward a direction substantially parallel to the rough surface 30a of the raw copper foil 30.

In addition, in an embodiment, during the arsenic-free electrolytic roughening treatment, the current density is between 20 to 80 A/dm2, preferably between 15 to 40 A/dm2 for smaller sized nodular copper particles. Further, the temperature of the roughening plating bath of the arsenic-free electrolytic roughening treatment is between 20 to 40° C.

After the arsenic-free electrolytic roughening treatment, the arsenic-free electrolytic surface protection treatment is performed to form a copper protective layer covering the nodular copper particles, so that the nodular copper particles are fixed on the rough surface 30a or the smooth surface 30b of raw copper foil 30 to prevent the phenomenon of "falling powder".

As shown in FIG. 2, the arsenic-free electrolytic surface protection treatment is performed by the curing unit 22. The curing unit 22 includes a curing tank 220 for carrying the curing plating bath L2 and a set of curing anode plates 221 disposed in the curing tank 220.

In this embodiment, after the first electroplating roughening process in the roughening tank 210, the raw copper foil 30 is transferred to the cleaning tank 23 through the transfer unit 20, and then transferred to the curing tank 220 for the arsenic-free electrolytic surface protection treatment.

During the arsenic-free electrolytic surface protection treatment, the curing anode plates 221 and the raw copper foil 30 are respectively applied with a positive voltage and a negative voltage to reduce the copper ions in the curing plating bath L2 and form a copper protective layer covering the multiple nodular copper particles on the raw copper foil 30. The curing plating bath L2 in the arsenic-free electrolytic surface protection treatment is also an arsenic-free plating bath containing 40 to 80 g/L of copper, 70 to 100 g/L of sulfuric acid, and the temperature of the curing plating bath L2 is about 50 to 70° C. In one embodiment, the current density is 2 to 9 A/dm2 in the arsenic-free electrolytic surface protection treatment.

In an embodiment, the raw copper foil 30 is transferred to the cleaning tank 23 from the curing tank 220 through the transfer unit 20, and then transferred to the next roughening tank 210 or the curing tank 220 sequentially, so as to repeatedly administer the arsenic-free electrolytic roughening treatment and the arsenic-free electrolytic surface protection treatment. In this embodiment, after the arsenic-free electrolytic roughening treatment and the arsenic-free electrolytic surface protection treatment, the roughened layer includes a plurality of copper particles, and the plurality of copper particles are needle-shaped copper particles or football-shaped copper particles.

Next, referring again to FIG. 1, in step S300, a surface treatment layer is formed on the roughened layer, wherein the surface treatment is made of a material including at least one non-copper metal element.

It should be noted that the surface treatment layer can protect the copper foil from being oxidized, and can also protect the copper foil from being corroded by the acid-base syrup during the wire making process. Therefore, the material of the surface treatment layer usually includes at least one non-copper metal element. In one embodiment, the material of the surface treatment layer is selected from the group consisting of zinc, nickel, chromium, and combinations thereof.

However, though these non-copper metal elements can protect the copper foil from oxidation or corrosion, it increases the resistance of the copper foil. Therefore, in the embodiment of the present disclosure, it is necessary to control the content of the non-copper metal element to reduce the resistance of the copper foil under the premise of providing protection to the copper foil, so that the transmission loss of the high-frequency signal can be reduced. In an embodiment, the total content of non-copper metal elements in the copper foil does not exceed 400 ppm.

Further, the material of the surface treatment layer may be a metal element or an alloy. In an embodiment, the material of the surface treatment layer is selected from the group consisting of zinc, nickel, chromium, and combinations thereof. If the material of the surface treatment layer includes zinc, chromium and nickel, the zinc content in the copper foil is 50 to 175 ppm, the nickel content in the copper foil is 20 to 155 ppm, and the chromium content in the copper foil is 20 to 70 ppm, but the total content of zinc, nickel and chromium does not exceed 400 ppm.

Specifically, the step of forming a surface treatment layer includes a heat-resistant plating treatment to form a heat-resistant layer; and an antioxidant plating treatment to form an antioxidant layer.

Referring to FIG. 2, the processing device 2b for performing step S300 also includes a plurality of transfer units 20 disposed on a production line, at least one heat resistant treatment resistant unit 24, at least one antioxidant treatment unit 25, and a plurality of cleaning tanks 23. The numbers of the heat resistant treatment resistant unit 24, the antioxidant treatment unit 25 and the cleaning tank 23 can be adjusted according to actual needs. The plurality of transfer units 20 transfer the raw copper foil 30' after the arsenic-free electrolytic roughening treatment and the arsenic-free electrolytic surface protection treatment to the heat resistant treatment resistant unit 24 and the antioxidant treatment unit 25 according to a preset process.

The heat resistant treatment resistant unit 24 includes a heat resistant bath tank 240 for carrying the first plating bath L3 and a set of first anode plates 241 disposed in the heat resistant bath 240. As shown in FIG. 2, during the heat-resistant plating treatment, the roughened raw copper foil 30' is transferred into the heat resistant bath tank 240 that has been loaded with the first plating bath L3. Further, in the present embodiment, the content of the non-copper metal element is controlled by controlling the content of zinc and nickel in the first plating bath L1, and the current density.

Accordingly, during the heat-resistant plating treatment, the first plating bath L1 of the embodiment of the present disclosure includes 1 to 4 g/L of zinc and 0.3 to 2.0 g/L of nickel. Further, during the heat-resistant plating treatment, the current density is 0.4 to 2.5 A/dm$^2$. In the present embodiment, during the heat-resistant plating treatment, zinc ions and nickel ions in the first plating bath L3 are reduced, and a zinc alloy heat-resistant layer is formed on the raw copper foil 30'.

Next, the raw copper foil 30' is transferred to the antioxidant treatment unit 25 by the transfer unit 20. Similarly, the antioxidant treatment unit 25 includes an antioxidant treatment tank 250 for carrying the second plating bath L4, and a set of second anode plates 251 disposed in the antioxidant treatment tank 250. The second plating bath L4 during the antioxidant plating treatment includes 1 to 4 g/L of chromium oxide and 5 to 20 g/L of sodium hydroxide, and the current density is 0.3 to 3.0 A/dm$^2$. During the electrochemical plating treatment, the chromium ions in the second plating bath L4 are reduced, and an antioxidant layer is formed on the raw copper foil 30'.

That is to say, in this embodiment, the surface treatment layer is a laminated structure, and the laminated structure includes at least a heat-resistant layer and an antioxidant layer. The content of each non-copper metal element in the copper foil can be controlled by controlling the thickness of the heat-resistant layer and the antioxidant layer, the concentration of non-copper metal ions (e.g., zinc ions, nickel ions, and chromium ions) in the first plating bath L3 and the second plating bath L4, and the current density.

It should be further noted that the foregoing process is merely an embodiment illustrating how the total content of non-copper elements (including non-copper metal elements and non-metal elements) in the copper foil can be made to not exceed 450 ppm, but is not intended to limit the scope of the present disclosure. In fact, under the premise that the total content of non-copper elements in the copper foil does not exceed 450 ppm, the process can be increased or decreased according to actual needs, or the parameters in the process can be adjusted. For example, one of the steps of heat-resistant plating treatment and antioxidant treatment may be omitted, or a surface treatment layer having heat and oxidation resistance may be formed in a single process.

Furthermore, even if the parameters of the heat-resistant plating treatment and the antioxidant plating treatment, for example the non-copper metal ion concentration in the first plating bath, the non-copper metal ion concentration of the second plating bath, and the current density of the heat-resistant plating treatment are slightly different from those disclosed in the above-exemplified embodiments, by adjusting the thickness of the heat-resistant layer and the thickness of the antioxidant layer, the total content of non-copper elements in the copper foil can also be controlled.

In an embodiment, the thickness of the surface treatment layer is 10 to 50 Å. In addition, the ratio of the surface treatment layer thickness to the total thickness of the copper foil ranges from $1.0 \times 10^{-5}$ to $3.0 \times 10^{-4}$, so that the total content of the non-copper metal element in the copper foil does not exceed 400 ppm. Furthermore, in other embodiments, the surface treatment layer may also be a single layer structure mixed by a heat resistant material and an antioxidant material, but the present disclosure is not limited thereto.

In addition, the surface treatment layer of the present embodiment is not limited to including only the heat resistant material or the antioxidant material, and other materials may be added according to requirements. That is, in addition to the above-mentioned heat treatment and antioxidant treatment, the method of manufacturing a copper foil for high frequency transmission of the embodiment of the present disclosure may further include performing a silane coupling treatment or other surface treatment. However, in the subsequent surface treatments, the content of non-copper elements in the copper foil may be increased, as long as the total content of non-copper elements in the copper foil does not exceed 450 ppm, and the copper foil resistance can remain low, thereby reducing the electrical loss of high-frequency signal transmission.

Based on the above, in the embodiment of the present disclosure, the electrical loss of the copper foil applied to the high-frequency signal transmission is not just reduced by reducing the surface roughness of the copper foil, but also by adjusting the process parameters in the steps of forming the electrochemical copper foil, the roughened layer and the surface treatment layer, optimizing the microstructure of the electrochemical copper foil, and reducing the content of non-copper elements (including non-metallic elements and non-copper metal elements) to reduce copper foil resistance. As such, the method for manufacturing a copper foil for high-frequency signal transmission provided by the present disclosure can reduce the electrical loss during high-frequency signal transmission without further reducing the surface roughness of the copper foil, which defeats a pre-conception in the art that "the loss of high frequency transmission can only be reduced by reducing the surface roughness of the copper foil", to solve issues associated with conventional methods.

After heating at 200° C. for 2 hours, the copper foil produced by the manufacturing method of the embodiment of the present disclosure was measured by the method described in Section 2.5.14 of IPC-TM-650. As a result of the measurement, even if the surface roughness of the copper foil is between 2 to 3 μm, the weight resistivity of the copper foil still can be less than 0.16 ohm-gram/m2.

Figure 3:
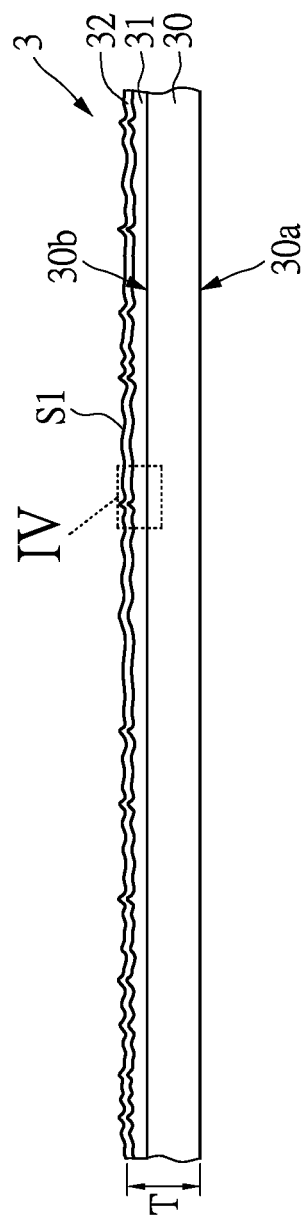
FIG. 3 is a partial sectional schematic view of the copper foil of an embodiment of the present disclosure.
Figure 4:
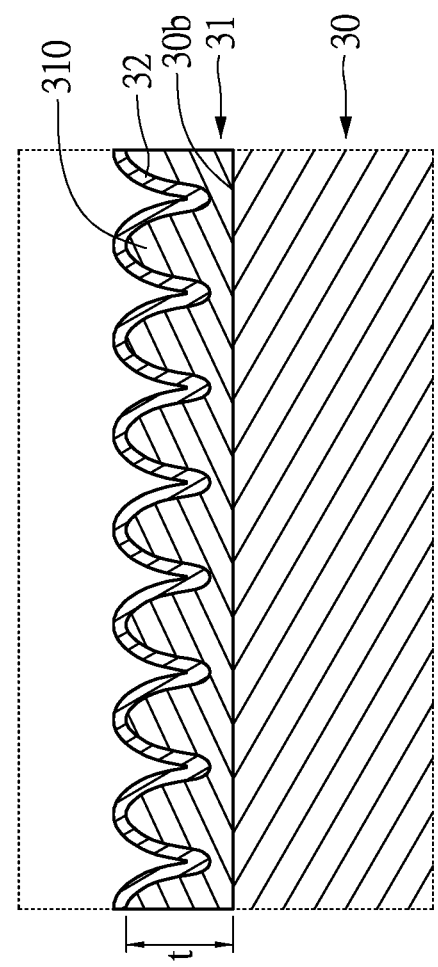
FIG. 4 is a partial enlarged schematic view of section IV of FIG. 3 of the copper foil of an embodiment of the present disclosure.

FIG. 3 shows a partial sectional schematic view of an electrolytic copper foil according to an embodiment of the present disclosure. FIG. 4 is a partially enlarged schematic view of the copper foil of section IV of FIG. 3. The copper foil 3 of the embodiment of the present disclosure includes a raw copper foil 30, a roughened layer 31 on the raw copper foil 30, and a surface The raw copper foil 30 has a smooth surface 30a and the rough surface 30b opposite to the smooth surface 30a, the smooth surface 30a refers to a surface of the raw copper foil 30 contacting to the cathode wheel (not showing in the FIGs) during electrolysis, and the rough surface 30b is a surface of the raw copper foil 30 contacting the electrolyte.

In one embodiment, the grain size of the raw copper foil 30 is between 5 to 10 μm. It should be noted that the higher the purity of the copper foil 1, the better the conductivity, which allows the loss of high-frequency signal transmission to be reduced. However, it is both difficult and costly to obtain a high-purity copper foil.

As described above, in the embodiment of the present disclosure, the resistance of the copper foil 3 is further reduced by optimizing the microstructure of the raw copper foil 30, that is, by controlling the copper grain size of the raw copper foil 30. Therefore, in the embodiment of the present disclosure, the grain size of the raw copper foil 30 is between 5 to 10 μm, and the resistance value of the copper foil 3 is further increased, which allow the transmission loss of the high frequency signal to be reduced. In the embodiment of the present disclosure, the roughened layer 31 is an arsenic-free roughened layer, and the thickness t is about 0.1 to 2 μm.

As shown in FIG. 4, the roughened layer 31 includes a plurality of copper particles 310 after the roughening treatment and the curing treatment, and the plurality of copper particles are needle-shaped copper particles or football-shaped copper particles. Each of the copper particles 310 extends in a direction which is not parallel to the rough surface 30b. As described above, since the electric resistance of arsenic is high, the resistance value of the electrolytic copper foil will increase if the arsenic content in the electrolytic copper foil is too high. Therefore, in the embodiment of the present disclosure, the roughened layer 31 of the copper foil 3 is an arsenic-free roughened layer, which can further reduce the resistance value of the copper foil 3, and is advantageous for high-frequency signal transmission.

Referring to FIG. 3, the material of the surface treatment layer 32 may be a metal element or an alloy. In an embodiment, the material of the surface treatment layer 32 is selected from the group consisting of zinc, nickel, chromium, and combinations thereof. As described above, the thickness of the surface treatment layer 32 should be within a certain range, so that the resistance of the copper foil 3 is low enough to reduce transmission loss, and the copper layer can be protected from oxidation or corrosion.

In the embodiment of the present disclosure, the ratio of the thickness of the surface treatment layer 32 to the total thickness of the copper foil 3 ranges from $1.0 \times 10^{-5}$ to $3.0 \times 10^{-4}$ to lower the resistance of the copper foil 3. In an embodiment, the total thickness T of the copper foil 3 is between 6 to 400 μm, and the thickness of the surface treatment layer 32 is between 10 to 50 Å. In this embodiment, the copper foil 3 has a laminating surface S1, and the ten point height of irregularities of the laminating surface is 2 to 3 μm.

In the embodiment of the present disclosure, the roughened layer 31 of the copper foil 3 does not include the arsenic element, and the ratio of the thickness of the surface treatment layer 32 to the total thickness of the copper foil 3 is low, so that the total content of the non-copper element in the copper foil 3 can be lowered. Accordingly, the copper foil 3 of the embodiment has lower resistance. When applying the copper foil 3 of the embodiment of the present disclosure to a high frequency signal transmission, it provides lower transmission loss.

Figure 5:
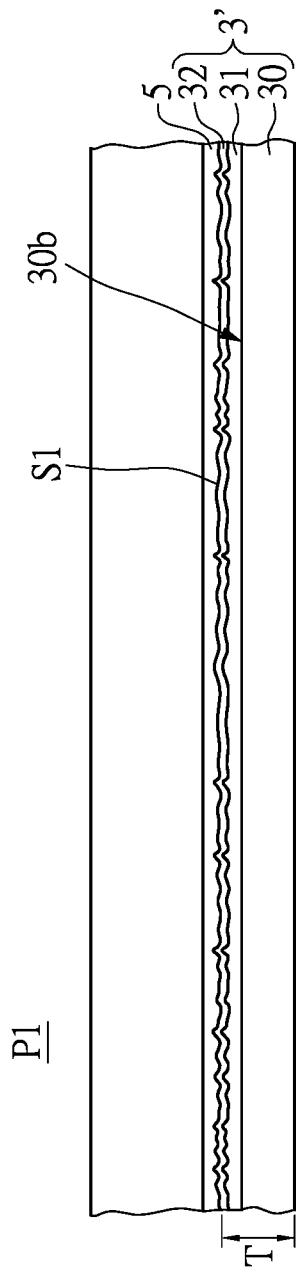
FIG. 5 is a sectional schematic view of the circuit board assembly of an embodiment of the present disclosure.
Figure 6:
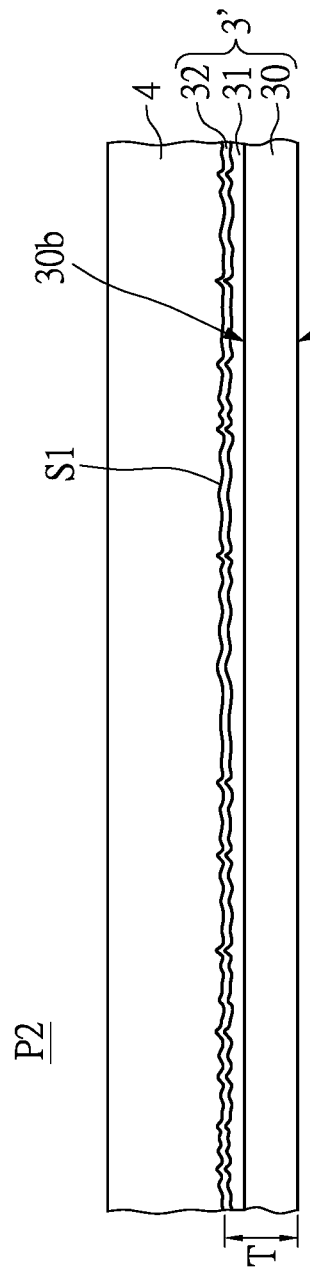
FIG. 6 is a sectional schematic view of the circuit board assembly of other embodiment of the present disclosure.

The present disclosure also provides a method of circuit board assembly for high frequency transmission. Reference is made to FIG. 5 and FIG. 6, each showing a sectional schematic view of the circuit board assembly in different embodiments of the present disclosure. In the embodiment of the present disclosure, the copper foil can be applied to different circuit board assemblies P1, P2 such as a rigid printed circuit board (PCB), a flexible printed circuit board (FPC), and the like, but the present disclosure is not limited thereto. The circuit board assemblies P1, P2 of FIG. 5 and FIG. 6 are formed by laminating a substrate 4 and a copper foil 3' face-to-face against each other, with the laminating surface S1 of the copper foil 3' facing the substrate 4.

The substrate 4 can be a high-frequency substrate, for example a resin substrate such as an epoxy resin substrate, a polyphenylene oxide resin substrate (PPO) or a fluorine-based resin substrate, or a substrate made of a material such as polyimide, ethylene terephthalate, polycarbonate, liquid crystal polymer or polytetrafluoroethylene.

In addition, in the embodiment of FIG. 5, the step of laminating the copper foil 3' and the substrate 4 face-to-face further includes: providing an adhesive layer 5, so that the copper foil 3' and the substrate 4 are bonded to each other through the adhesive layer 5.

In the embodiment of FIG. 6, the substrate 4 can be directly bonded to the copper foil 3' by hot laminating without an additional adhesive layer. In the embodiment, the substrate 4 may be made of a material such as a liquid crystal polymer or a glass fiber substrate (Pre-preg). Therefore, the substrate 4 can be directly bonded with the laminating surface S1.

Further, the manufacturing method of circuit board assembly for high frequency transmission includes: etching the copper foil to form a wiring layer.

Figure 7:
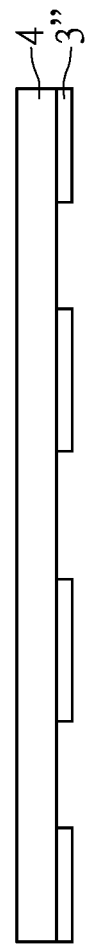
FIG. 7 is a sectional schematic view of the circuit board assembly of other embodiment of the present disclosure.

Referring to FIG. 7, a sectional schematic view of a circuit board assembly of another embodiment of the present disclosure is shown. In detail, in the method of manufacturing the circuit board assembly P3 of this embodiment, the circuit board assembly P1 or P2 as shown in FIG. 5 or FIG. 6 may be formed first. Thereafter, the copper foil 3' is further etched to form a wiring layer 3" as shown in FIG. 7. The etching may be carried out by any conventional technique, and will not be described in detail herein.

It should be noted, in the embodiment of the present disclosure, the copper foil 3 is subjected to a heat of 200° C. for 2 hours and has a weight resistivity of less than 0.16 ohm-gram/m². Therefore, in the circuit board assemblies P1 to P3 of the embodiment, the surface roughness of the laminating surface S1 of the copper foil 3' do not need to be reduced to 2 μm or less, and the electrical loss of high-frequency signal transmission can be reduced. Therefore, the copper foil 3 and the substrate 4 or the adhesive layer 5 have a higher bonding strength, and the bonding strength can be maintained while reducing the electrical loss.

In summary, the advantages of the present disclosure is that, by controlling the grain size of the raw copper foil 30 to reduce the grain boundary, and controlling the total content of non-copper elements in the copper foil 3, the conductivity of the copper foil 3 can be increased without lowering the surface roughness any further. Therefore, when the copper foil 3 of the embodiment of the present disclosure is applied to the circuit board assemblies P1 to P3 for transmitting high frequency signals, it provides a lower electrical loss. In addition, since the surface roughness of the copper foil 3 is maintained at a constant value, the bonding strength between the copper foil 3 and the substrate 4 can be maintained while reducing the electrical loss.

The above-mentioned descriptions represent merely the exemplary embodiment of the present disclosure, without any intention to limit the scope of the present disclosure thereto. Various equivalent changes, alterations or modifications based on the claims of the present disclosure are all consequently viewed as being embraced by the scope of the present disclosure.

What is claimed is:

1. A method of manufacturing a copper foil for high frequency transmission, comprising:
    producing a raw copper foil having a predetermined surface by an electrolyzing process;
    forming a roughened layer on the predetermined surface of the raw copper foil, wherein the step of forming the roughened layer further includes an arsenic-free electrolytic roughening treatment for forming a plurality of copper particles and an arsenic-free electrolytic surface protection treatment for forming a copper protective layer covering the plurality of copper particles;
    forming a surface treatment layer on the roughened layer to form the copper foil, wherein the surface treatment layer is made of a material including at least one non-copper metal element, and a concentration of the non-copper metal element in the copper foil is smaller than 400 ppm; and
    after the copper foil is heated under 200° C. for 2 hours, a weight resistivity of the copper foil is less than 0.16 ohm-gram/m².

2. The method of manufacturing a copper foil for high frequency transmission according to claim 1, wherein a ratio of thickness of the surface treatment layer to a total thickness of the copper foil ranges from $1.0 \times 10^{-5}$ to $3.0 \times 10^{-4}$.

3. The method of manufacturing a copper foil for high frequency transmission according to claim 2, wherein the thickness of the surface treatment layer is 10 to 50 Å.

4. The method of manufacturing a copper foil for high frequency transmission according to claim 1, wherein the copper foil includes at least a non-copper element, and a total concentration of the non-copper element in the copper foil is less than 450 ppm.

5. The method of manufacturing a copper foil for high frequency transmission according to claim 1, wherein the non-copper metal element of the surface treatment layer is selected from the group consisting of zinc, nickel, chromium, and the combination thereof.

6. The method of manufacturing a copper foil for high frequency transmission according to claim 5, wherein the non-copper metal element of the surface treatment layer includes zinc, chromium and nickel, and the zinc content in the copper foil is 50 to 175 ppm, the nickel content in the copper foil is 20 to 155 ppm, and the chromium content in the copper foil is 20 to 70 ppm.

7. The method of manufacturing a copper foil for high frequency transmission according to claim 1, wherein the step of forming the surface treatment layer includes: performing a heat-resistant plating treatment to form a zinc alloy heat-resistant layer, wherein a first plating solution composition of the heat-resistant plating treatment includes zinc from 1 to 4 g/L and nickel form 0.3 to 2.0 g/L, and a current density in performing the heat-resistant plating treatment is 0.4 to 2.5 A/dm².

8. The method of manufacturing a copper foil for high frequency transmission according to claim 7, wherein, the step of forming the surface treatment layer further includes: performing an oxidation resistant plating process to form an antioxidant layer, wherein a second plating solution composition used in the oxidation resistant plating process includes 1 to 4 g/L chromium oxide and 5 to 20 g/L of sodium hydroxide, and a current density used in performing the oxidation-resistant plating treatment is 0.3 to 3.0 A/dm².

9. The method of manufacturing a copper foil for high frequency transmission according to claim 1, wherein a roughening plating bath of the arsenic-free electrolytic roughening treatment and a curing plating bath of the arsenic-free electrolytic surface protection treatment are arsenic-free plating baths, and a temperature of the roughening plating bath of the arsenic-free electrolytic roughening treatment is between 20 to 40° C., and a current density is between 15 to 40 A/dm²; and a temperature of the curing plating bath of the arsenic-free electrolytic surface protection treatment is between 50 to 70° C., and a current density is between 2 to 9 A/dm².

10. The method of manufacturing a copper foil for high frequency transmission according to claim 1, the step of producing the raw copper foil further comprising: applying an electric current to an electrolyte, and the electrolyte includes copper ions 50 to 90 g/L, sulfuric acid 50 to 120 g/L and chloride ions with a concentration of less than 1.5 ppm.

11. The method of manufacturing a copper foil for high frequency transmission according to claim 10, wherein a temperature of the electrolyte is 50 to 80° C., and an initial grain size of the raw copper foil is 0.1 to 10 μm.

12. The method of manufacturing a copper foil for high frequency transmission according to claim 10, wherein a temperature of the electrolyte is 30 to 50° C., and an initial crystal grain size of the raw copper foil is 0.1 to 5 μm; the method further comprising: applying a heat treatment, a temperature of the heat treatment being greater than a re-growth temperature of the initial crystal grain, so that a final grain size of the raw copper foil is 5 to 10 μm, wherein a temperature of the heat treatment is 125° C. to 200° C.

13. The method of manufacturing a copper foil for high frequency transmission according to claim 1, wherein a thickness of the roughened layer is 0.1 to 2 μm, and the roughened layer is arsenic-free, the roughened layer includes the plurality of copper particles, and the plurality of copper particles are needle-shaped copper particles or football-shaped copper particles.

14. The method of manufacturing a copper foil for high frequency transmission according to claim 1, wherein the copper foil has a laminating surface, and a ten point height of irregularities of the laminating surface is 2 to 3 μm.

15. A manufacturing method of circuit board assembly for high frequency transmission, comprising:
   providing the copper foil manufactured by the method according to claim 1, the copper foil has a laminating surface; and
   laminating a substrate with the copper foil with the laminating surface facing the substrate.

16. The manufacturing method of circuit board assembly for high frequency transmission according to claim 15, wherein the substrate is a high frequency substrate, and the high frequency substrate is an epoxy resin substrate, a polyphenylene oxide resin substrate, a fluorine-based resin substrate, or a liquid crystal polymer substrate.

17. The manufacturing method of circuit board assembly for high frequency transmission according to claim 15, wherein the step of laminating the substrate with the copper foil further comprises: providing an adhesive layer to bond the copper foil and the substrate to each other.

18. The manufacturing method of circuit board assembly for high frequency transmission according to claim 15, further comprising: etching the copper foil to form a wiring layer.

19. The manufacturing method of circuit board assembly for high frequency transmission according to claim 15, wherein the circuit board assembly is a printed circuit board or a flexible printed circuit board.

* * * * *